United States Patent
Taruki et al.

(10) Patent No.: US 11,942,579 B2
(45) Date of Patent: Mar. 26, 2024

(54) LIGHT EMITTING DEVICE AND ADAPTIVE DRIVING BEAM HEADLAMP

(71) Applicant: NICHIA CORPORATION, Anan (JP)

(72) Inventors: Toru Taruki, Tokushima (JP); Daisuke Sanga, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/502,939

(22) Filed: Oct. 15, 2021

(65) Prior Publication Data
US 2022/0037564 A1 Feb. 3, 2022

Related U.S. Application Data

(63) Continuation of application No. 15/893,411, filed on Feb. 9, 2018, now Pat. No. 11,177,417.

(30) Foreign Application Priority Data

Feb. 13, 2017 (JP) .................................. 2017-024482
Oct. 23, 2017 (JP) .................................. 2017-204140

(51) Int. Cl.
*H01L 33/50* (2010.01)
*H01L 27/15* (2006.01)
(Continued)

(52) U.S. Cl.
CPC .......... *H01L 33/505* (2013.01); *H01L 27/156* (2013.01); *H01L 33/0093* (2020.05);
(Continued)

(58) Field of Classification Search
CPC ....... H01L 27/156; H01L 33/08; H01L 33/22; H01L 33/36; H01L 33/38; H01L 33/382;
(Continued)

(56) References Cited

U.S. PATENT DOCUMENTS

2001/0001207 A1 5/2001 Shimizu et al.
2005/0224830 A1 10/2005 Blonder et al.
(Continued)

FOREIGN PATENT DOCUMENTS

CN 1411614 A 4/2003
CN 102117821 A 7/2011
(Continued)

OTHER PUBLICATIONS

Final Office Action on U.S. Appl. No. 15/893,411 dated Apr. 19, 2019.
(Continued)

*Primary Examiner* — Herve-Louis Y Assouman
*Assistant Examiner* — Christopher M Roland
(74) *Attorney, Agent, or Firm* — Foley & Lardner LLP

(57) ABSTRACT

A light emitting device includes: a base; a first terminal and a second terminal located at a surface of the base; a light emitting element array chip mounted on the base, the light emitting element array chip including: a support substrate, a plurality of first wirings and a plurality of second wirings disposed on the support substrate, and a plurality of light emitting elements, each of the light emitting elements arranged on the first wiring and the second wiring and electrically connected to the first wiring and the second wiring; and a plurality of wires including a first wire connecting the first wiring to the first terminal, and a second wire connecting the second wiring to the second terminal.

10 Claims, 11 Drawing Sheets

(51) Int. Cl.
*H01L 33/00* (2010.01)
*H01L 33/08* (2010.01)
*H01L 33/22* (2010.01)
*H01L 33/36* (2010.01)
*H01L 33/38* (2010.01)
*H01L 33/62* (2010.01)
*F21S 41/153* (2018.01)
*F21S 41/19* (2018.01)
*F21Y 115/10* (2016.01)

(52) U.S. Cl.
CPC .............. *H01L 33/08* (2013.01); *H01L 33/22* (2013.01); *H01L 33/36* (2013.01); *H01L 33/382* (2013.01); *H01L 33/502* (2013.01); *H01L 33/62* (2013.01); *F21S 41/153* (2018.01); *F21S 41/192* (2018.01); *F21Y 2115/10* (2016.08); *H01L 2933/0041* (2013.01); *H01L 2933/0066* (2013.01)

(58) Field of Classification Search
CPC ..... H01L 33/50; H01L 33/501; H01L 33/502; H01L 33/504; H01L 33/505; H01L 33/507; H01L 33/508; H01L 33/62; H01L 2933/0041; H01L 2933/0066
See application file for complete search history.

(56) References Cited

U.S. PATENT DOCUMENTS

| | | |
|---|---|---|
| 2005/0244993 A1 | 11/2005 | Bogner et al. |
| 2010/0140640 A1 | 6/2010 | Shimokawa et al. |
| 2010/0314647 A1 | 12/2010 | Won et al. |
| 2011/0156056 A1 | 6/2011 | Krames et al. |
| 2011/0156064 A1 | 6/2011 | Seo et al. |
| 2011/0180820 A1 | 7/2011 | Seo et al. |
| 2011/0186892 A1 | 8/2011 | Jeong |
| 2011/0233587 A1 | 9/2011 | Unno |
| 2012/0007044 A1 | 1/2012 | Seo et al. |
| 2013/0106279 A1* | 5/2013 | Hayashida .......... H01L 25/0753 313/512 |
| 2013/0119422 A1* | 5/2013 | Nagai .................. H01L 33/387 257/98 |
| 2013/0228793 A1 | 9/2013 | Kim et al. |
| 2014/0061702 A1 | 3/2014 | Yamamoto et al. |
| 2014/0061703 A1 | 3/2014 | Von Malm |
| 2014/0110737 A1 | 4/2014 | Matsumura |
| 2014/0191258 A1 | 7/2014 | Akimoto et al. |
| 2014/0219304 A1 | 8/2014 | Lee et al. |
| 2015/0014716 A1 | 1/2015 | Von Malm |
| 2015/0129918 A1 | 5/2015 | Ikegami et al. |
| 2015/0364643 A1 | 12/2015 | Sumitomo et al. |
| 2016/0056341 A1 | 2/2016 | Tajima et al. |
| 2016/0163537 A1 | 6/2016 | Tanaka |
| 2016/0247855 A1 | 8/2016 | Von Malm |
| 2017/0084787 A1 | 3/2017 | Emura et al. |
| 2017/0221962 A1 | 8/2017 | Tajima et al. |
| 2017/0352700 A1 | 12/2017 | Von Malm |
| 2018/0286915 A1 | 10/2018 | Yeon et al. |
| 2020/0251626 A1 | 8/2020 | Lee et al. |

FOREIGN PATENT DOCUMENTS

| | | | |
|---|---|---|---|
| CN | 103477455 A | | 12/2013 |
| JP | 2003-243726 A | | 8/2003 |
| JP | 2003-526212 A | | 9/2003 |
| JP | 2008218674 A | * | 9/2008 |
| JP | 2011-108589 A | | 6/2011 |
| JP | 2015-501085 A | | 1/2015 |
| JP | 2015-082643 A | | 4/2015 |
| JP | 2015-211058 A | | 11/2015 |
| JP | 2015-228389 A | | 12/2015 |
| JP | 2016-149389 A | | 8/2016 |
| WO | WO-2012/091008 A1 | | 7/2012 |

OTHER PUBLICATIONS

Final Office Action on U.S. Appl. No. 15/893,411 dated Oct. 27, 2020.
Non-Final Office Action on U.S. Appl. No. 15/893,411 dated Feb. 7, 2020.
Non-Final Office Action on U.S. Appl. No. 15/893,411 dated Mar. 15, 2021.
Non-Final Office Action on U.S. Appl. No. 15/893,411 dated Aug. 7, 2019.
Non-Final Office Action on U.S. Appl. No. 15/893,411 dated Oct. 5, 2018.
U.S. Notice of Allowance on U.S. Appl. No. 15/893,411 dated Jul. 19, 2021.

* cited by examiner

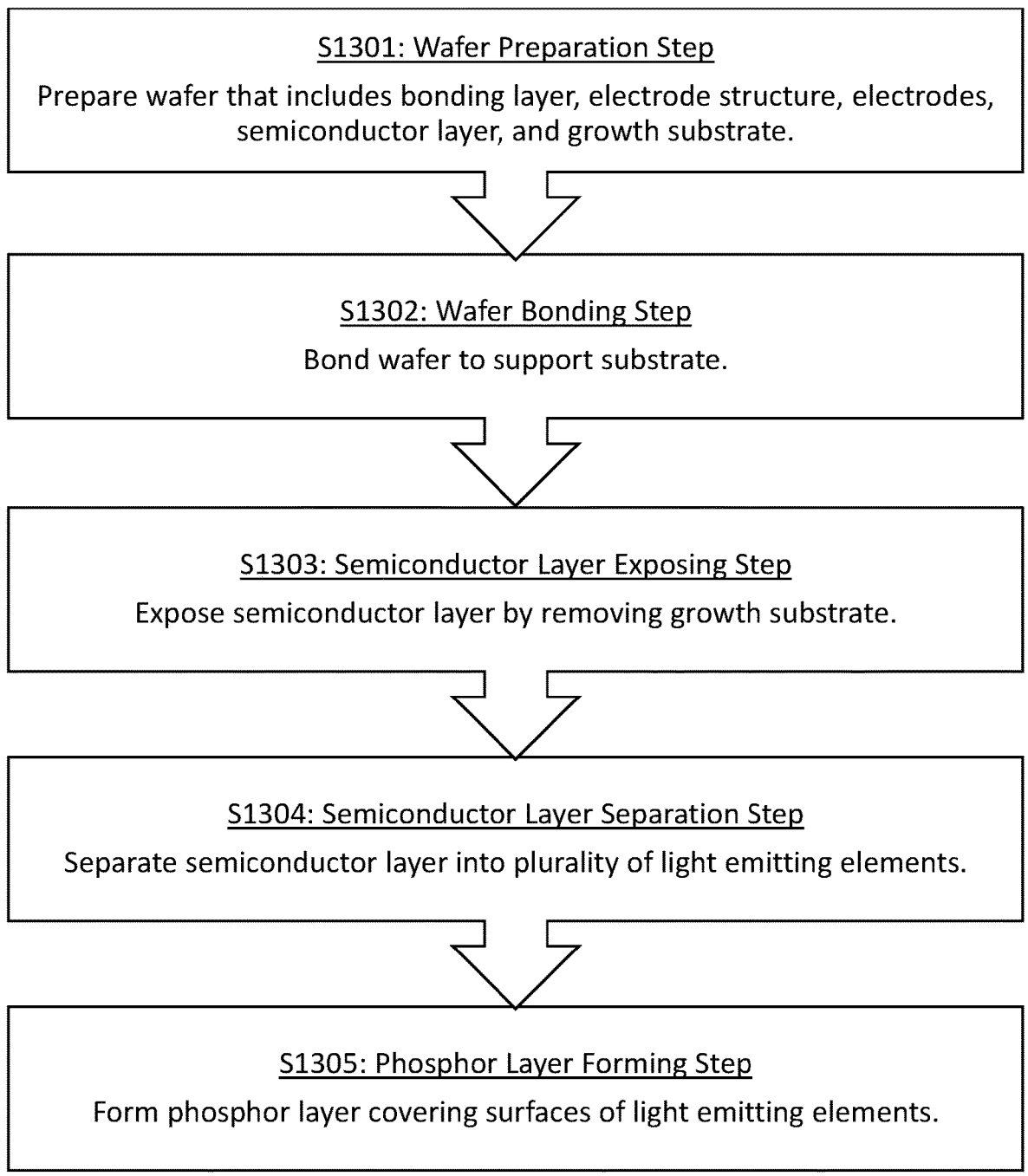

LIGHT EMITTING DEVICE AND ADAPTIVE DRIVING BEAM HEADLAMP

CROSS-REFERENCE TO RELATED APPLICATIONS

The present application is a continuation of U.S. patent application Ser. No. 15/893,411, filed on Feb. 9, 2018, which claims priority to Japanese Application No. 2017-024482, filed on Feb. 13, 2017, and Japanese Patent Application No. 2017-204140, filed on Oct. 23, 2017, the contents of which are hereby incorporated by reference in their entirety.

BACKGROUND

The present disclosure relates to a light emitting device and a method for manufacturing the same.

In the past, a light emitting device having multiple light emitting elements arranged therein has been proposed for use, for example, as headlights installed in vehicles or the like. This light emitting device is configured to turn off individual light emitting elements or a group of light emitting elements. Light emitting devices of this type require ingenuity for reducing the leakage of light from an illuminating light emitting element to the adjacent light emitting elements that are turned off. For this reason, such a conventional light emitting device includes a phosphor ceramic plate with a plurality of light shielding parts that serve as partitions for individual light emitting elements, as disclosed, for example, in Japanese Unexamined Patent Application Publication No. 2011-108589.

SUMMARY

The luminance of such a conventional light emitting device, however, can be reduced because some of the light from the light emitting elements is absorbed by the light shielding parts. In the case of a conventional light emitting device, moreover, the ceramic plate needs to be highly precisely aligned with the light emitting elements so that the light shielding parts are positioned along the borders of adjacent light emitting elements. Alignment of light shielding parts can be difficult when densely arranging miniaturized light emitting elements.

Accordingly, an object of certain embodiments of the present disclosure is to provide a higher luminance light emitting device. Another object is to provide a method for manufacturing a higher luminance light emitting device.

According to one embodiment, a method for manufacturing a light emitting device includes a step of preparing a wafer including, successively from the upper face side, an electrode structure that includes multilayer wiring, a semiconductor layer electrically connected to the electrode structure, and a growth substrate for the semiconductor layer; a step of bonding the wafer to a support substrate; a step of exposing the semiconductor layer by removing the growth substrate from the wafer which has been bonded to the support substrate; a step of separating the semiconductor layer into a plurality of light emitting elements by forming grooves on the surface of the wafer on the semiconductor layer side; and a step of forming a phosphor layer having recesses and protrusions on the surface thereof and covering the surfaces of the light emitting elements by forming a coating film on the surfaces of the plurality of light emitting elements by applying a slurry composed of phosphor particles contained in a solvent followed by vaporizing the solvent in the coating film.

According to another embodiment, the light emitting device is equipped with a light emitting element array chip which includes a support substrate, an electrode structure disposed on the support substrate, and a plurality of light emitting elements arranged on and electrically connected to the electrode structure; and a phosphor layer directly covering the surface of the light emitting element array chip, wherein the phosphor layer has recesses and protrusions on the surface thereof, and the protrusions and the recesses are such that the layer thicknesses of the protrusions are at least twice the layer thicknesses of the recesses.

According to certain embodiments of the present disclosure, a higher luminance light emitting device can be produced. Moreover, a higher luminance light emitting device can be manufactured in a simplified manner.

BRIEF DESCRIPTION OF THE DRAWINGS

FIG. 13 is a flow chart showing a method for manufacturing the light emitting device according to an example embodiment.

DETAILED DESCRIPTION

Figure 1:
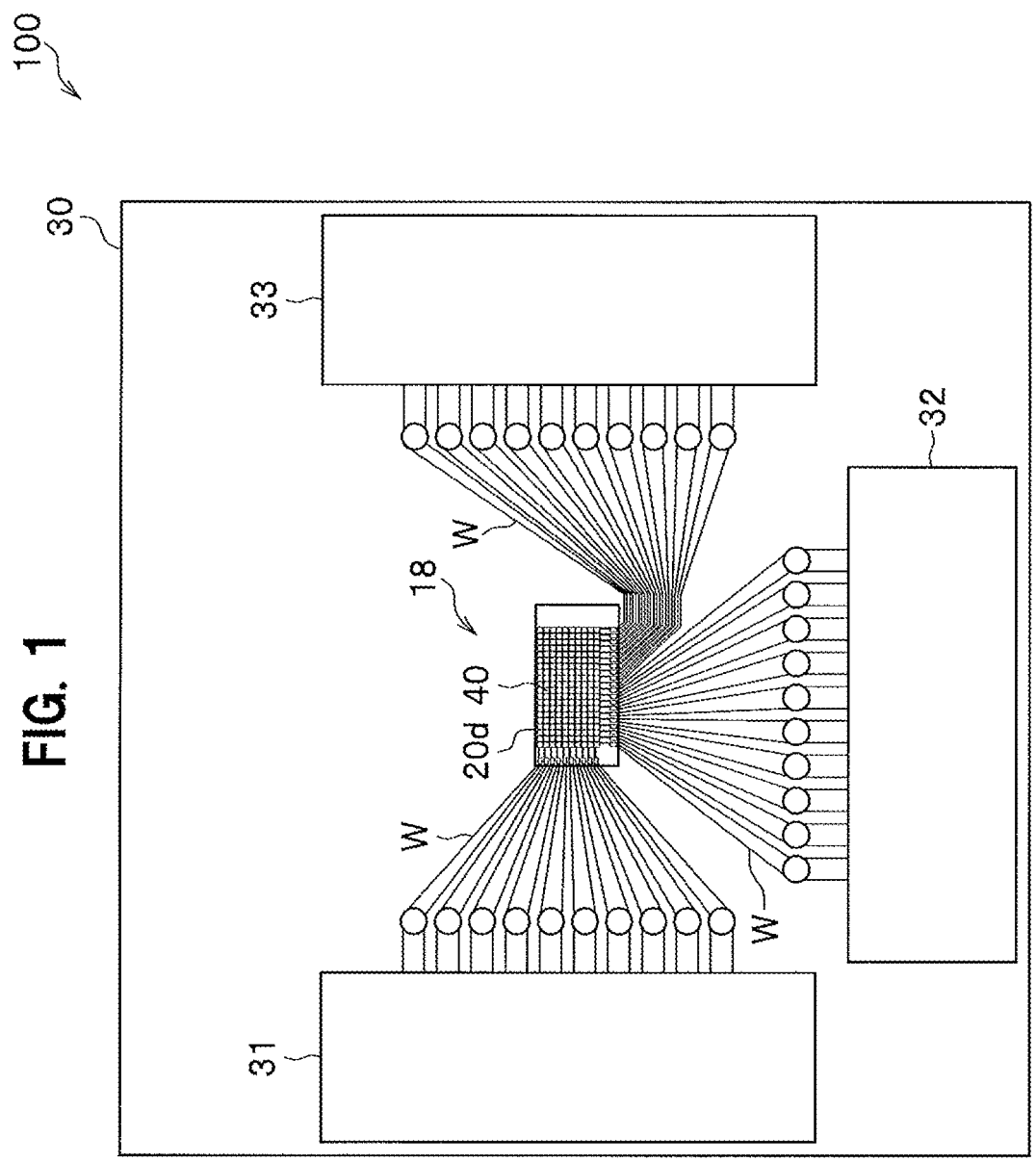
FIG. 1 is a schematic plan view of the light emitting device construction related to the first embodiment.

Certain embodiments of the present invention will be explained with reference to the accompanying drawings. The embodiments described below, however, are illustrations of the light emitting devices for the purpose of giving shape to the technical ideas of the invention, and the scope of the present invention is not limited to those described below unless otherwise specifically noted. The sizes and positional relationship of the members shown in each drawing may be exaggerated for clarity of explanation.

In the light emitting device according to the embodiments, moreover, "upper," "lower," "right," "left," or the like can switch depending on the situation. The terms such as "upper," "lower," and the like herein are used to indicate relative positions of the constituent elements in the drawing being referred to for explanation purposes, and are not intended to indicate the absolute positions thereof unless otherwise specifically noted.

First Embodiment

Construction of Light Emitting Device

Figure 3A:
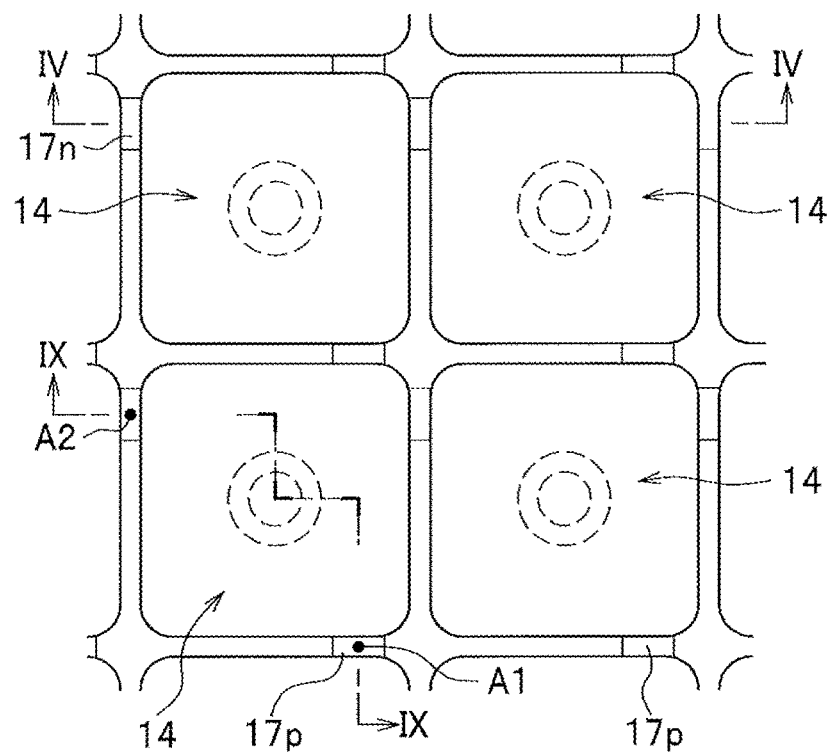
FIG. 3A is an enlarged schematic plan view of a portion of the light emitting element array chip when viewed from the light extraction face side.
Figure 3B:
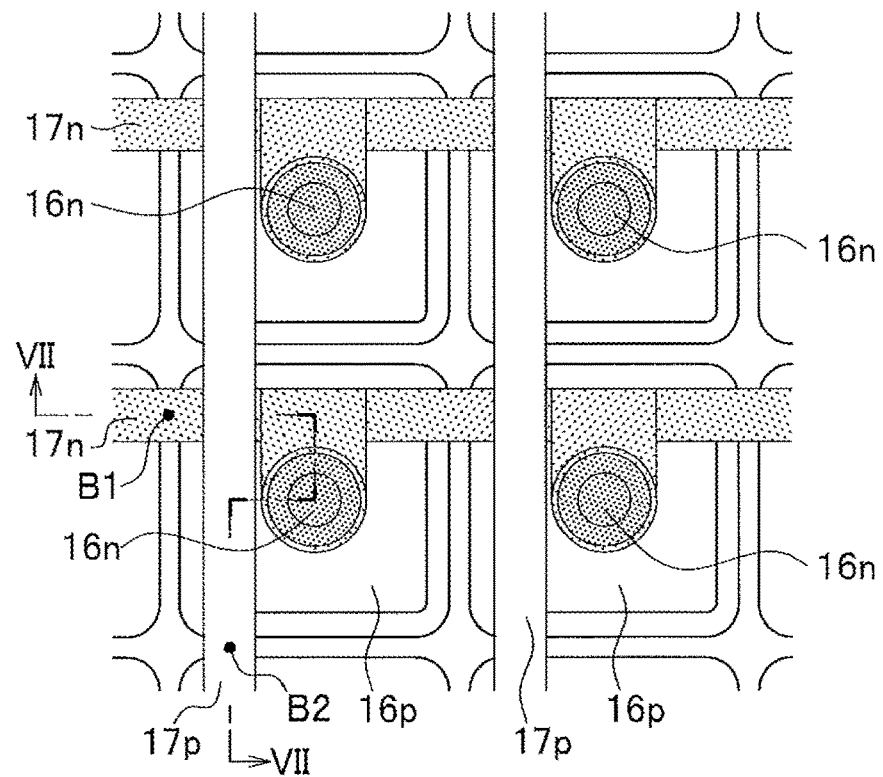
FIG. 3B is an enlarged schematic plan view of a portion of the light emitting element array chip when viewed from the electrode structure side.
Figure 4:
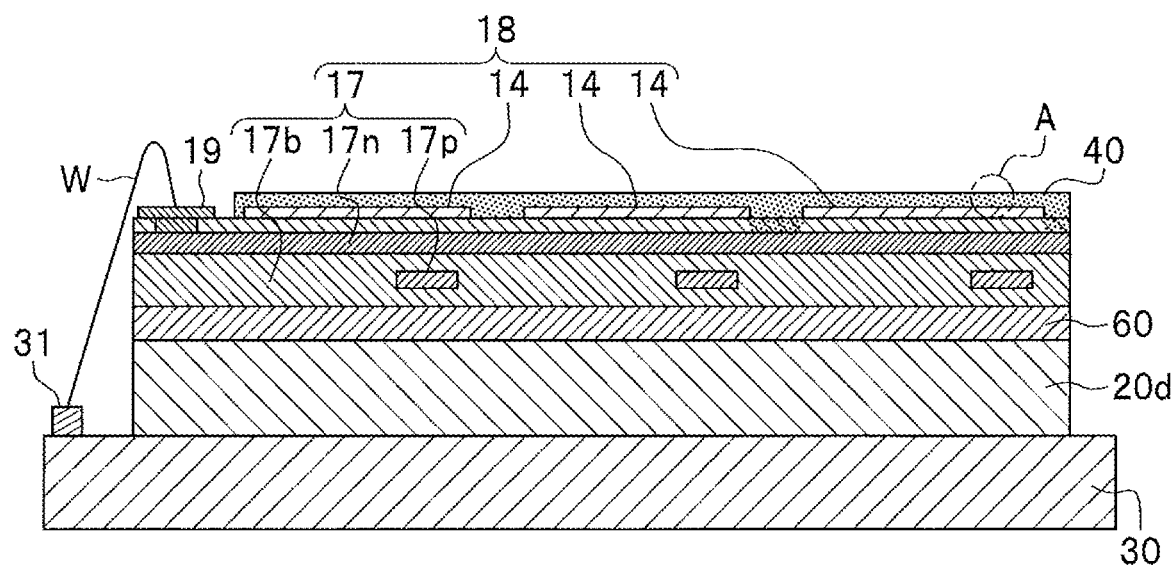
FIG. 4 is a schematic cross-sectional view taken along line IV-IV in FIG. 3A.

The construction of the light emitting device 100 according to the first embodiment will be explained with reference to FIG. 1 to FIG. 5. FIG. 4 is a cross-sectional view taken along line IV-IV in FIG. 3A, schematically showing here the portion in which three light emitting elements 14 are disposed for explanation purposes.

The light emitting device 100 includes a light emitting element array chip 18 and a phosphor layer 40 that directly covers the surface of the light emitting array chip 18. In this embodiment, the light emitting element array chip 18 has a support substrate 20d, an electrode structure 17 disposed on the support substrate 20d, and a plurality of light emitting elements 14 arranged on and electrically connected to the electrode structure 17. The phosphor layer 40 has recesses and protrusions at the surface thereof, and the protrusions and the recesses are such that the layer thicknesses of the protrusions are at least twice the layer thicknesses of the recesses. Each component will be successively explained below.

Base

In this embodiment, the light emitting element array chip 18 is mounted on a base 30, which serves as a secondary mounting substrate. Examples of the materials for the base 30 include insulating materials, such as glass epoxy, resins, ceramics, and the like. In this embodiment, the base 30 is formed in a rectangular shape in a plan view.

The base 30 includes electrode terminals 31, 32, and 33 as the terminals to be connected to an external power supply.

The electrode terminal 31 is connected to multiple first wires 17n (for example, 10) of the light emitting array chip 18 via wires W.

The electrode terminals 32 and 33 are each connected to multiple second wires 17p (for example, 10 each) of the light emitting element array chip 18 via wires W.

Light Emitting Element Array Chip

Support Substrate

The support substrate 20d is a substrate for supporting a plurality of light emitting elements 14. The plurality of light emitting elements 14 are bonded to the support substrate 20d via the electrode structure 17 and the bonding layer 60 described later.

Specific examples of the support substrate 20d include conductive materials, such as a semiconductor composed of Si, GaAs, or the like, a metal such as Cu, Ge, Ni, or the like, and a composite material such as Cu—W.

Light Emitting Element

In this embodiment, the light emitting element array chip 18 is provided with a plurality of light emitting elements 14, for example, 200 pieces, on the support substrate 20d.

Light emitting diodes (LEDs) are preferably used for the light emitting elements 14. Light emitting diodes of any given wavelength can be selected. For blue and green light emitting diodes, for example, those employing ZnSe, nitride-based semiconductor ($In_XAl_YGa_{1-X-Y}N$, 0≤0≤Y, X+Y≤1), or GaP can be used.

The light emitting elements 14 each have as the semiconductor layer 12, successively from the support substrate 20d side, a second semiconductor layer, an emission layer, and a first semiconductor layer. As shown in FIG. 3B, the light emitting elements 14 each include a first electrode 16n electrically connected to the first semiconductor layer, and a second electrode 16p electrically connected to the second semiconductor layer. The first electrode 16n and the second electrode 16p are disposed on the same face of the light emitting elements 14.

The first electrode 16n is an electrode for supplying electric current to the first semiconductor layer. It is preferable to form the first electrode 16n by using, for example, at least one selected from Ti, Al, and Al alloys. The second electrode 16p is an electrode for supplying electric current to the second semiconductor layer. The second electrode 16p functions as a full surface electrode for uniformly diffusing electric current across the second semiconductor layer. It also functions as a reflective film. The second electrode 16p can be formed by using, for example, Ag or a metal film containing an Ag alloy.

The semiconductor layer 12 in the light emitting elements 14 preferably has a small thickness. Reducing the thickness of the semiconductor layer 12 in the light emitting elements 14 can attenuate the lateral propagation of the light released from the lateral faces of the light emitting elements 14. This can make the luminance of a light emitting portion (i.e., the light emitting elements that are turned on) more distinct from the luminance of a non-light emitting portion (i.e., the light emitting elements that are turned off), even when the light emitting elements 14 are densely arranged. Specifically, the thickness of the semiconductor layer 12 in the light emitting elements 14 can range from 1 to 10 μm, and the intervals between light emitting elements 14 can range from 3 to 25 μm.

Electrode Structure

Figure 2:
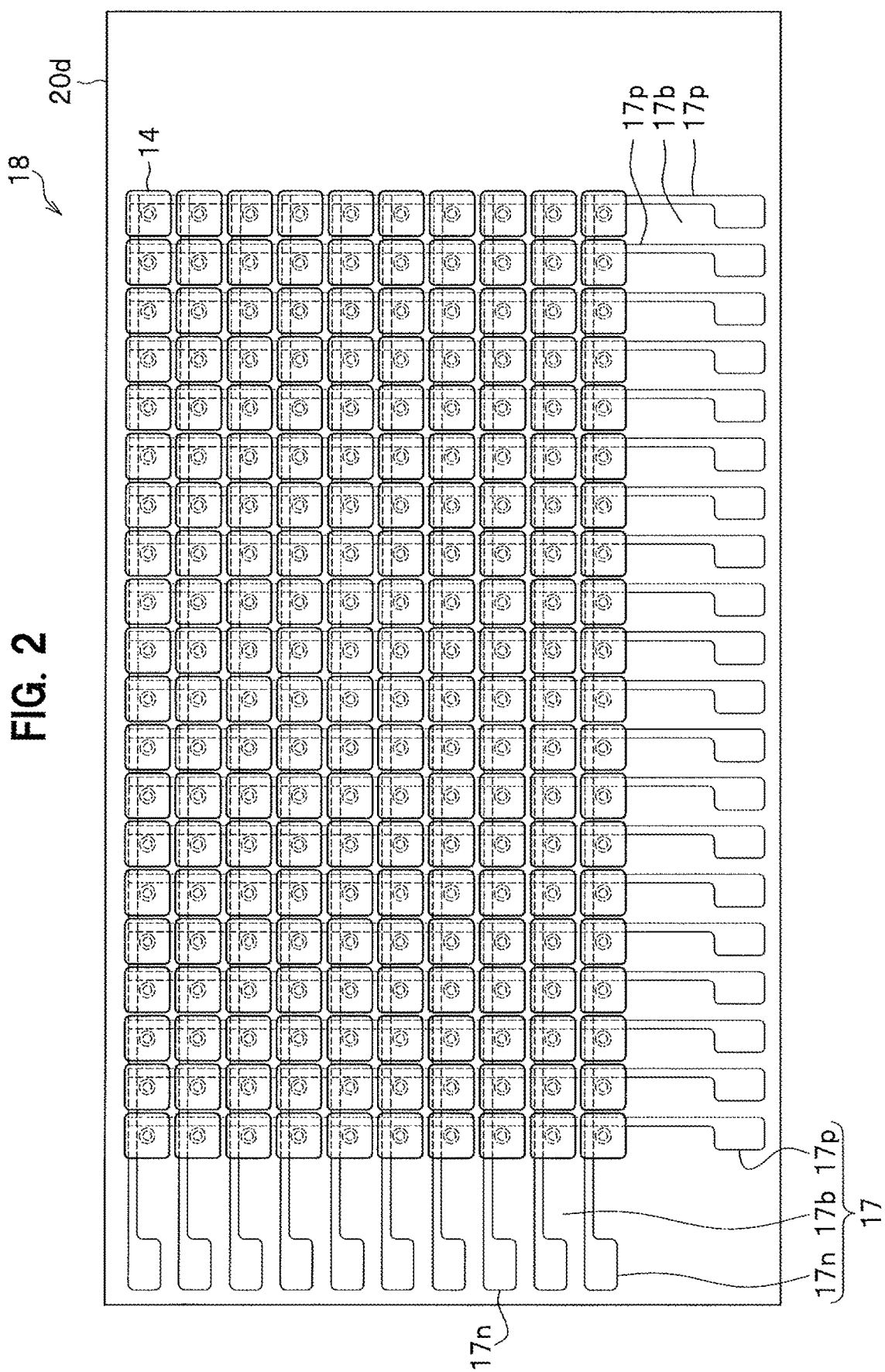
FIG. 2 is a schematic plan view of a light emitting element array chip.

The electrode structure 17, as shown in FIG. 2, includes a plurality of first wires 17n, a plurality of second wires 17p, and an inter-wiring insulation film 17b. The electrode structure 17 includes a so-called multilayer wiring structure in which the first wires 17n and the second wires 17p are vertically stacked (stacking direction of the semiconductor layers) via the inter-wiring insulation film 17b. The first wires 17n are electrically connected to the first electrodes 16n of the light emitting elements 14. The second wires 17p are electrically connected to the second electrodes 16p of the light emitting elements 14. The first wires 17n and the second wires 17p can be formed, for example, with Au.

As shown in FIG. 2 to FIG. 4, the inter-wiring insulation film 17b is disposed to provide insulation between the first wires 17n and the second wires 17p, as well as between the first and second electrodes 16n, 16p of the light emitting elements 14 and the first and second wires 17n, 17p. The inter-wiring insulation film 17b can be constructed, for example, with $SiO_2$, $ZrO_2$, SiN, SiON, BN, SiC, SiOC, AlN, AlGaN, or the like.

The light emitting element array chip 18 is driven in the passive matrix mode. The first wires 17n and the second wires 17p are arranged vertically and horizontally so as to intersect one another orthogonally in a plan view. The intersections of the first wires 17n and the second wires 17p overlap the light emitting elements 14 which are arranged in a matrix in a plan view. In this manner, the light emitting elements 14 arranged at the intersections of the first wires 17n and the second wires 17p can be individually illuminated. The size of each light emitting element 14 is, for example, 150 μm per side, preferably 100 μm at most. The first electrodes 16n and the second electrodes 16p of the light emitting elements 14 are electrically connected to the first wires 17n and the second wires 17p, respectively, via the holes suitably created in the inter-wiring insulation film 17b of the electrode structure 17.

Bonding Layer

In this embodiment, a bonding layer 60 is provided between the electrode structure 17 and the support substrate 20d. Providing the bonding layer 60 can flatten the surface of the electrode structure 17 to thereby facilitate its bonding to the support substrate 20d. The bonding layer 60 is formed by using, for example, an insulation film such as $SiO_2$, or a metal film such as Al.

Phosphor Layer

Figure 5:
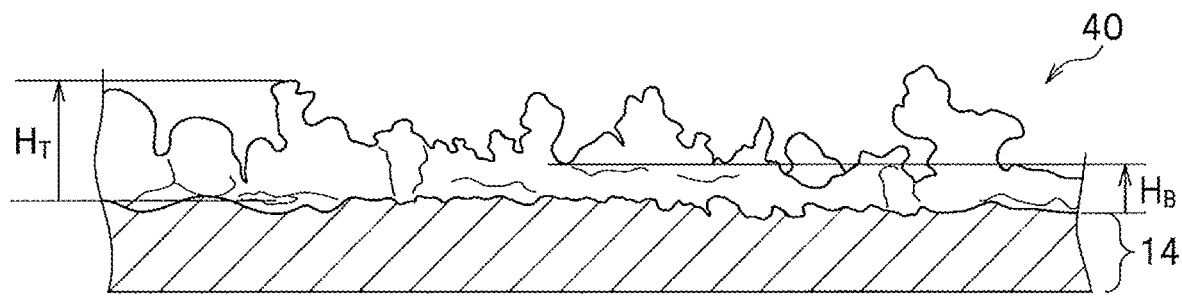
FIG. 5 is an enlarged schematic cross-sectional view of the portion A in FIG. 4.

As shown in FIG. 4 and FIG. 5, the light emitting device 100 includes a phosphor layer 40 that covers the upper face of the light emitting element array chip 18, which is the light extraction face. The phosphor layer 40 contains, for example, a light transmissive resin and phosphor particles.

The refractive index of the light transmissive resin can be, for example, 1.30 to 1.50. This is preferable because it increases the scattering of light at the interfaces between the phosphor particles and the light transmissive resin, and a small refractive index difference from that of the air can improve light extraction. Examples of such resins include phenyl silicone resins, dimethyl silicone resins, and the like.

For the phosphors, those used in the art can be suitably selected. For example, phosphors excitable by light emitted from a blue or ultraviolet light emitting element include cerium-activated yttrium aluminum garnet-based phosphors (YAG:Ce); cerium-activated lutetium aluminum garnet-based phosphors (LAG:Ce); europium- and/or chromium-activated nitrogen-containing calcium aluminosilicate-based phosphors (for example, $CaO—Al_2O_3—SiO_2$:Eu); europium-activated silicate-based phosphors (($Sr,Ba)_2SiO_4$:Eu); nitride-based phosphors, such as β-SiAlON phosphors, CASN-based phosphors ($CaAlSiN_3$:Eu), SCASN-based phosphors ((Sr,Ca)$AlSiN_3$:Eu); KSF-based phosphors ($K_2SiF_6$:Mn); sulfide-base phosphors, and quantum dot phosphors. By combining these phosphors with a blue or ultraviolet light emitting element, light emitting devices of various emission colors (e.g., a white light emitting device) can be produced. In the case of obtaining a light emitting device 100 that can emit white light, the types and the concentrations of the phosphors contained in the phosphor layer 40 are adjusted to produce white light. The concentration of a phosphor added to the medium, including a resin, for example, is about 5 to 50 mass percent.

The phosphor layer 40 preferably has a small thickness, the average layer thickness of the phosphor layer is preferably, for example, 50 μm or less. Providing a thin phosphor layer 40 physically narrows the paths relative to the in-plane direction and increases scattering, thereby making propagation of light difficult. This reduces propagation of the light from the illuminating light emitting elements 14 to the adjacent light emitting elements 14 that are turned off when the light emitting elements 14 are individually illuminated, thereby increasing the luminance. The average particle size of the phosphor particles contained in the phosphor layer 40 preferably is smaller than the average layer thickness of the phosphor layer 40, for example 1 to 30 μm. The average particle size of the phosphor particles is a numerical value referred to as Fisher Sub Sieve Sizer's number, and is measured using air permeability. The average particle size of the phosphor particles can also be obtained by a cross-sectional image captured by using, for example, a scanning electron microscope (SEM) or transmission electron microscope (TEM).

By directly covering the upper faces of the light emitting elements 14 (i.e., the surface of the first semiconductor layer) with a thinly formed phosphor layer 40 as described above, lateral propagation of light within the phosphor layer 40 can be reduced without providing light shielding parts that partition the phosphor layer 40. In other words, since there are no light shielding parts that can reduce luminance, a higher luminance light emitting device can be produced.

The phosphor layer 40 may have a flat surface, but preferably has a surface having protrusions and recesses as shown in FIG. 5. Shaping the surface of the phosphor layer 40, which is the emission face of the light emitting device 100, with protrusions and recesses having large height differences therebetween can further reduce the lateral propagation of light attributable to the refractive index difference between the phosphor layer 40 (i.e., the refractive index of the light transmissive resin) and the air. This is because the refractive index of a resin being higher than that of the air increases the scattering of light entering the air present in the recesses. Moreover, the paths are physically narrower in the in-plane direction in the recesses, making it more difficult for the light to propagate in the in-plane direction. In other words, the presence of protrusions and recesses at the surface makes the phosphor layer 40 with further reduced propagation of light in the in-plane direction. The large height difference between protrusions and recesses refer to the protrusions and recesses having a thickness difference equivalent to or larger than the thickness of a recess. It specifically refers to a surface composed of protrusions and recesses in any given region (for example, in the area of at least one light emitting element making up the light emitting element array chip) in which the maximum value $H_T$ of the layer thicknesses of the protrusions of the phosphor layer 40 is at least twice the minimum value $H_B$ of the layer thicknesses of the recesses. Further, the thickness of the phosphor layer 40 at a protrusion refers to the height $H_T$ of the protrusion as shown in FIG. 5, for example. Further, the thickness of the phosphor layer 40 at a recess refers to the height $H_B$ of the recesses as shown in FIG. 5.

The thickness of the phosphor layer can be obtained, for example, by capturing the cross-sectional image of the phosphor layer 40 in a given region, and measuring the thickness of the phosphor layer from the obtained image.

When the surface of the phosphor layer 40 has protrusions and recesses, the average layer thickness of the phosphor layer 40 is preferably 50 μm at most, more preferably, the thickness of the protrusions is 50 μm at most. The average layer thickness of the phosphor layer can be obtained, for example, by measuring the thickness of the phosphor layer using a cross-sectional image of a given region which includes at least one light emitting element.

Method for Manufacturing a Light Emitting Device

Next, a method for manufacturing the light emitting device related to the present embodiment will be explained with reference to FIG. 6 to FIG. 10B. As shown in the flow chart of FIG. 13, the method for manufacturing the light emitting device 100 of this embodiment includes a wafer preparation step S1301, a wafer bonding step S1302, a semiconductor layer exposing step S1303, a semiconductor layer separation step S1304, and a phosphor layer forming step S1305, which are performed in that order. In this embodiment, moreover, a pad electrode forming step, a chip dividing step, and a chip mounting step are performed after the semiconductor separation step, but before the phosphor layer forming step. The materials used for, and the layout of, the members are as explained earlier with reference to the light emitting device 100, the explanations of which will be omitted here when appropriate.

Wafer Preparation Step S1301

Figure 6:
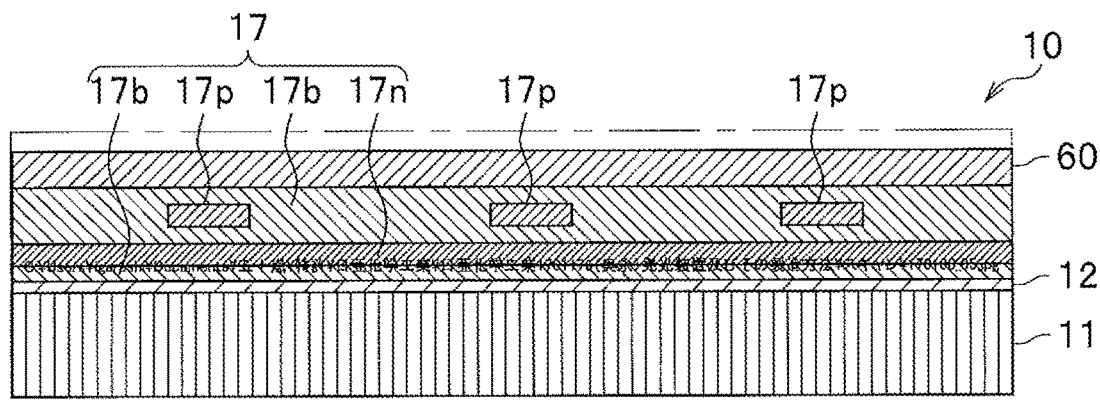
FIG. 6 is a schematic cross-sectional view of a wafer prepared by the method for manufacturing a light emitting device related to the first embodiment.

The wafer preparation step is a step of preparing a wafer 10 which has, successively from the upper face side, an electrode structure 17 which includes multilayer wiring, a semiconductor layer 12 electrically connected to the electrode structure 17, and a growth substrate 11 for the semiconductor layer 12. In this embodiment, as shown in FIG. 6, the wafer 10 is prepared with the electrode structure 17 which includes multilayer wiring where the first wires 17n and the second wires 17p are stacked in an up or down direction. Here, for illustration purposes, only the portion corresponding to the cross-sectional view in FIG. 4 is shown.

The wafer 10 has a growth substrate 11 made of sapphire or the like, a semiconductor layer 12, an electrode structure 17, and a bonding layer 60. The multilayer wiring of the electrode structure 17 can be formed by utilizing any method known in the art. For example, the first wires 17n and the second wires 17p can be formed by vapor deposition, sputtering, electroplating, electroless plating, or the like. Fabrication into desired electrode shapes can be accomplished by etching, lift-off, or the like by using a mask shaped by photolithography, printing, or the like.

Figure 7:
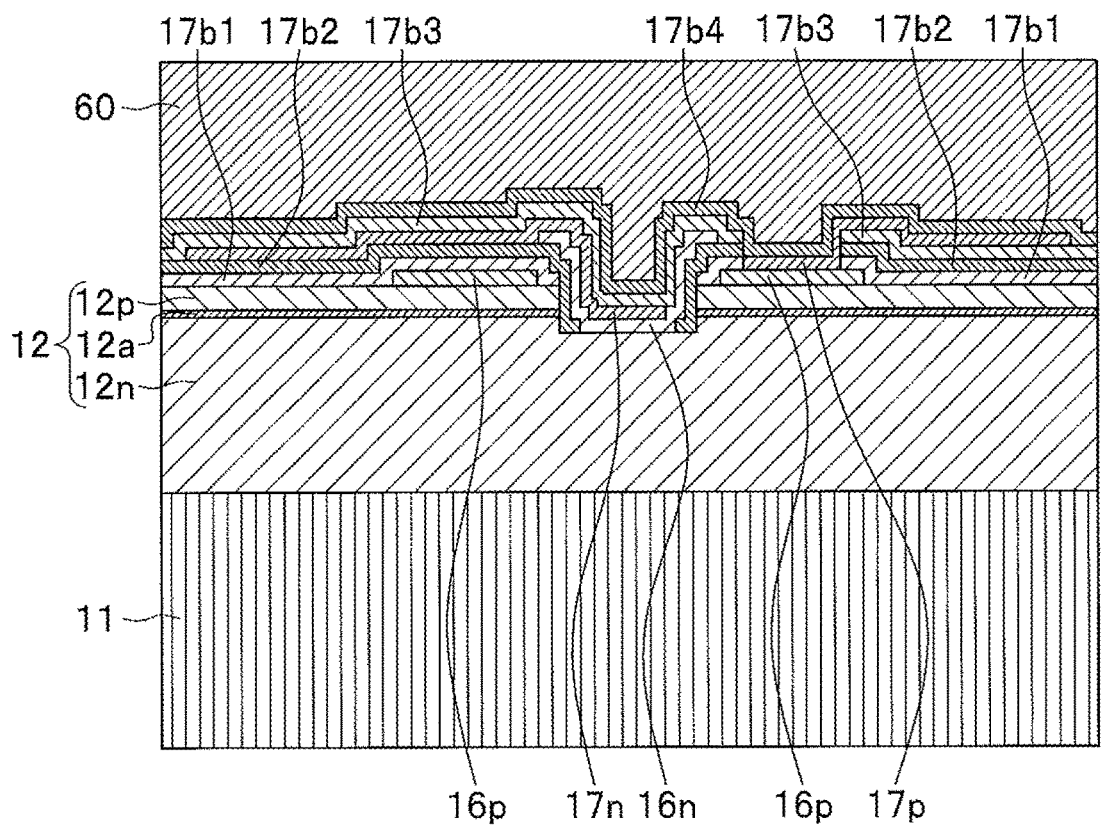
FIG. 7 is a cross-sectional view of an example of the wafer structure corresponding to line VII-VII in FIG. 3B.

The semiconductor layer 12, as shown in FIG. 7, includes a first semiconductor layer 12n, an emission layer 12a, and a second semiconductor layer 12p successively from the growth substrate 11 side. FIG. 7 is a cross-sectional view of an example of the wafer structure corresponding to line VII-VII in FIG. 3B. Here, the direction from the left to the right in FIG. 7 matches the direction from position B1 to position B2 on line VII-VII via the path indicated by the one-dot chain line in FIG. 3B. As shown in FIG. 7, the wafer 10 includes a first electrode 16n electrically connected to the first semiconductor layer 12n and a second electrode 16p electrically connected to the second semiconductor layer 12p on the face of the semiconductor layer 12 opposite the growth substrate 11. Moreover, the first electrode 16n and the second electrode 16p are electrically connected to the first wire 17n and the second wire 17p, respectively.

In the example shown in FIG. 7, the inter-wiring insulation film 17b includes, successively from the semiconductor layer 12 side, an insulation film 17b1, an insulation film 17b2, insulation film 17b3, and an insulation film 17b4.

The insulation film 17b1 has an opening on the second electrode 16p, and is disposed to cover the upper face of the second semiconductor layer 12p.

The insulation film 17b2 has an opening on the first semiconductor layer 12n, and is disposed to cover the upper face of the insulation film 17b1.

The insulation film 17b3 is disposed to cover the first wire 17n and the insulation film 17b2.

The insulation film 17b4 is disposed to cover the second wire 17p and the insulation film 17b3. The insulation film 17b4 is disposed to serve as an etch-stop layer at the bottom of the grooves along which the light emitting elements are separated later. Each insulation film is formed using, for example, SiN or $SiO_2$.

Wafer Bonding Step S1302

Figure 8A:
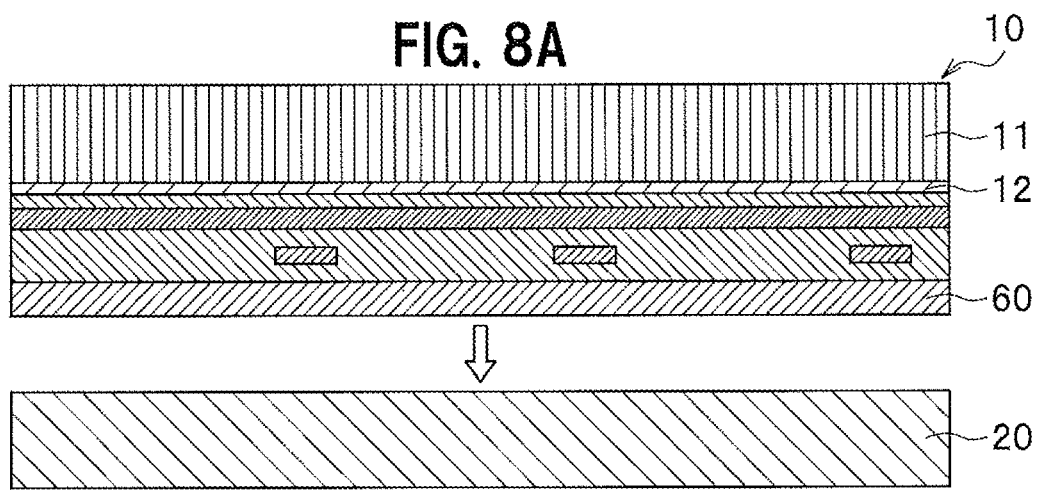
FIG. 8A is a cross-sectional view schematically showing the support substrate bonding step in the method for manufacturing a light emitting device related to the first embodiment.

The wafer bonding step S1302 is a step of bonding the wafer 10 to a support substrate 20. At this time, a bonding layer 60 or another metal layer may be present on the multilayer wiring. Moreover, the wafer may be directly bonded by surface activated bonding or the like. In the wafer bonding step, as shown in FIG. 8A, the wafer 10 is bonded to the support substrate 20 so that the bonding layer 60 and the support substrate 20 oppose one another. The support substrate 20 should be prepared before this step.

Semiconductor Layer Exposing Step S1303

Figure 8B:
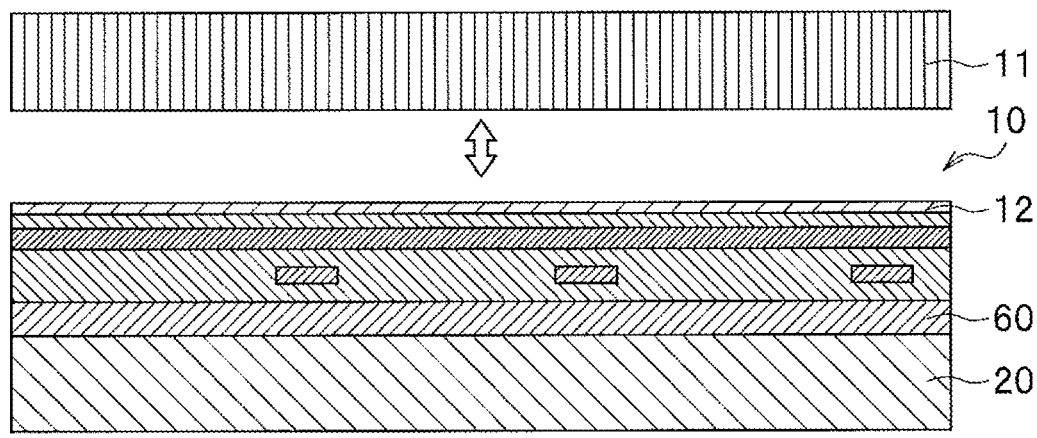
FIG. 8B is a cross-sectional view schematically showing the semiconductor layer exposing step in the method for manufacturing a light emitting device related to the first embodiment.

The semiconductor layer exposing step S1303 is a step of removing the growth substrate 11 from the wafer 10 which has been bonded to the support substrate 20 thereby exposing the semiconductor layer 12. FIG. 8B shows the wafer 10 which is turned over after removing the growth substrate 11. In the semiconductor layer exposing step, the growth substrate 11 is removed by degrading the interface between the growth substrate 11 and the semiconductor layer 12, more specifically the first semiconductor layer 12n, by irradiating a laser beam from the growth substrate 11 side which is made of sapphire or the like, for example, by employing a laser lift-off method. The separation of the growth substrate 11 may be accomplished by using other methods, such as a chemical lift-off method.

Semiconductor Layer Separation Step S1304

Figure 8C:
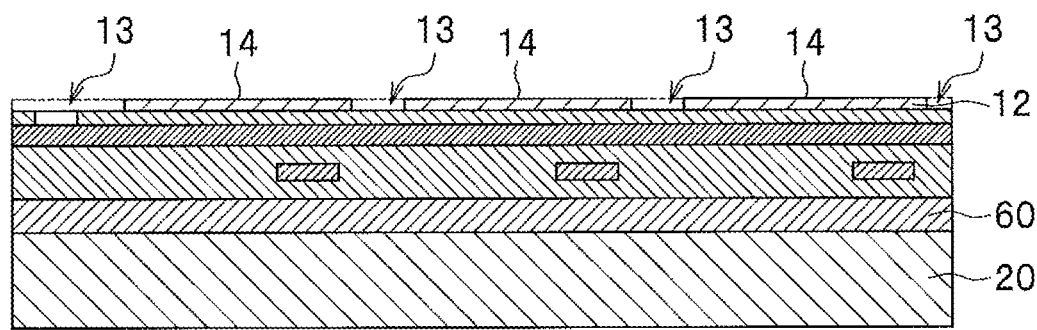
FIG. 8C is a cross-sectional view schematically showing the semiconductor layer separation step in the method for manufacturing a light emitting device related to the first embodiment.

The semiconductor layer separation step S1304 is a step of separating the semiconductor layer 12 into multiple light emitting elements 14 by forming grooves 13 on the surface of the semiconductor layer 12 on the side from which the growth substrate 11 has been removed. As shown in FIG. 8C, grooves 13 that penetrate the semiconductor layer 12 and reach the electrode structure 17 are formed in the bordering regions between the light emitting elements 14 by irradiating, for example, a laser beam from the upper face side (i.e., the first semiconductor layer side). In a plan view, the grooves 13 are formed lengthwise and crosswise in parallel to the first wires 17n and the second wires 17p.

At this time, if the thickness of the semiconductor layer 12 is, for example, 10 µm or less, the grooves 13 can be formed by grinding it all at once. If deeper grinding is required, however, forming fine grooves can be difficult. For this reason, the thickness of the semiconductor layer 12 may be reduced in advance by polishing, etching back, or the like. For example, after removing about 5 µm by applying a laser beam across the entire surface, a groove pattern may be formed using a resist followed by etching the remaining 5 µm.

Figure 9:
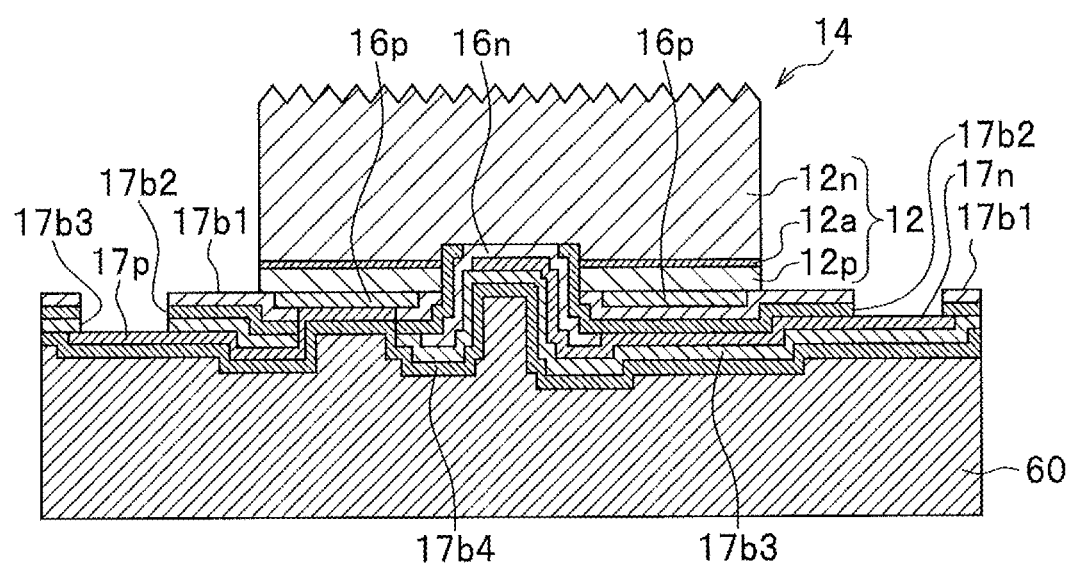
FIG. 9 shows an example of the light emitting element structure, and is a cross sectional view corresponding to line IX-IX in FIG. 3A.

Subsequently, for example, micro-protrusions and micro-recesses may be formed by roughening the upper face of the first semiconductor layer 12n in the light emitting elements 14, as shown in FIG. 9, by wet etching using an etching solution, such as TMAH (tetramethylammonium hydroxide), KOH aqueous solution, ethylenediamine pyrocatechol, or the like, or by dry etching.

FIG. 9 is an example of the structure of a light emitting element 14, and is a cross-sectional view corresponding to line IX-IX in FIG. 3A. Here, the direction from the left to the right in FIG. 9 matches the direction from position A1 to position A2 on line IX-IX via the path indicated by the one-dot chain line in FIG. 3A.

Pad Electrode Forming Step

Figure 10A:
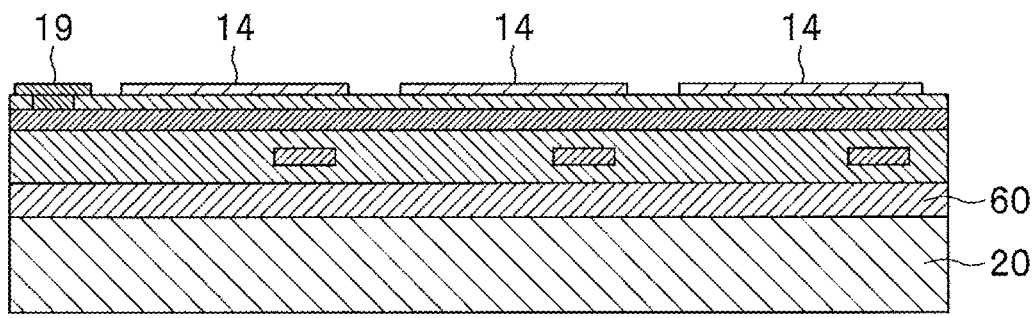
FIG. 10A is a cross-sectional view schematically showing the pad electrode forming step in the method for manufacturing a light emitting device related to the first embodiment.

The pad electrode forming step is a step of forming on the portions of the bottom faces of the grooves 13 formed on the wafer 10, i.e., the surface of the electrode structure 17, multiple pad electrodes 19 that are electrically connected to the first wires 17n or the second wires 17p. In the pad electrode forming step, portions of the first wires 17n and portions of the second wires 17p are exposed, as shown in FIG. 9, by removing portions of the inter-wiring insulation film 17b that covers the regions where the pad electrodes 19 are to be formed by dry etching or the like. Subsequently, using a prescribed metal material or the like, the pad electrodes 19 are formed in the prescribed regions of the electrode structure 17 by sputtering or the like as shown in FIG. 10A.

Chip Separation Step

The chip separation step is a step of forming multiple light emitting element array chips 18 by separating the wafer 10 bonded to the support substrate 20 into individual regions each including multiple light emitting elements 14 and multiple pad electrodes 19. The separation into chips can be accomplished by methods, such as dicing, scribing, laser scribing, or the like.

Chip Mounting Step

Figure 10B:
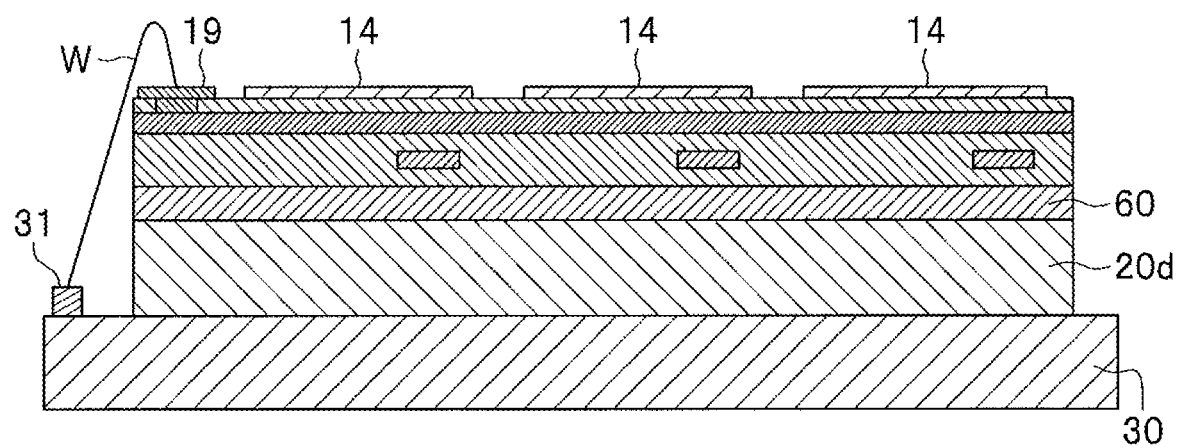
FIG. 10B is a cross-sectional view schematically showing the die bonding step in the method for manufacturing a light emitting device related to the first embodiment.

In the chip mounting step, a separated light emitting element array chip 18 is mounted on a package or base. Specifically, as shown in FIG. 10B, the light emitting array chip 18 is mounted on a base 30, and the multiple pad electrodes 19 formed on the light emitting element array chip 18 are connected to the electrode terminal 31 as well as the electrode terminals 32 and 33 (see FIG. 1) by wire bonding. A bonding layer may be provided on the back face of the support substrate 20 before separating the wafer into individual chips.

Phosphor Layer Forming Step S1305

The phosphor layer forming step S1305 is a step of forming a phosphor layer 40 that collectively covers the surface of the semiconductor layer 12 of the multiple light emitting elements 14 by applying a slurry composed of phosphor particles contained in a solvent. The average layer thickness of the phosphor layer 40 is preferably small; for example, 50 µm at most is preferable. Forming a thin phosphor layer 40 can attenuate the lateral propagation of light within the phosphor layer 40 without having to provide light shielding parts that partition the phosphor layer 40. In other words, because the phosphor layer forming step requires no alignment of light shielding parts, a higher luminance light emitting device can be produced in a simplified manner.

In the phosphor layer forming step, the slurry is prepared by mixing a solvent with a light transmissive resin and phosphor particles, and a coating film is formed on the light emitting element array chip 18 by using a coating method, such as spray coating, spin coating, screen printing, or the like. Among all, spray coating is preferable as the coating film can be formed to a film thickness with high precision and at high speed. A pulsed spray process, which sprays the coating material in a pulsed manner, i.e., intermittently, is more preferable as it can form the coating film to a film thickness with higher precision. Since the spray amount can be reduced when using a pulsed spray process, a coating film can be thinly formed while reducing the coating amount per spray. Subsequently vaporizing the solvent forms the phosphor layer 40 having protrusions and recesses on the surface as shown in FIG. 4.

Examples of the light transmissive resin used to form the phosphor layer 40 include phenyl silicone resins, dimethyl silicone resins, and the like. The type of the solvent can be suitably selected depending on the resin type.

Furthermore, it is preferable to make the phosphor layer a thin high-concentration phosphor layer in order to increase the contrast of the light emitting device. High concentration here means that the phosphor to resin weight ratio is, for example, 1:1 to 2:1. The slurry also contains a solvent or the like in addition to the phosphor and the resin.

The phosphor layer 40 having protrusions and recesses on the surface thereof can be formed, for example, under the spray coating conditions described below.

As an example, the slurry can be a formulation of phosphor particles, a resin as the binder, a solvent, and AEROSIL, with weight ratio denoted by a, b, c, and d, respectively. The AEROSIL is an additive for ensuring the stability of the slurry by preventing the phosphor particles from sinking in the slurry.

In this case, the weight ratio of the formulation can be a:b:c:d=15:10:25:1.

In the case of employing a YAG phosphor and a phenyl silicone resin, for example, the use of dimethyl carbonate as the solvent in the above formulation can form a substantially flat phosphor layer of about 20 µm in thickness.

In the case of employing a YAG phosphor and a dimethyl silicone resin, the use of n-heptane as the solvent can form protrusions and recesses having the lowest value $H_B$ of about 10 µm and the highest value $H_T$ of about 40 µm in layer thickness.

At this point, by formulating the slurry with a lower phosphor particle concentration, for example, a:b:c:d=10:10:25:1, the difference between the highest value $H_T$ and the lowest value $H_B$ in layer thickness can be reduced.

On the other hand, by formulating the slurry with a higher phosphor particle concentration, for example, a:b:c:d=20:10:25:1, the difference between the highest value $H_T$ and the lowest value $H_B$ in layer thickness can be increased.

Second Embodiment

Figure 11A:
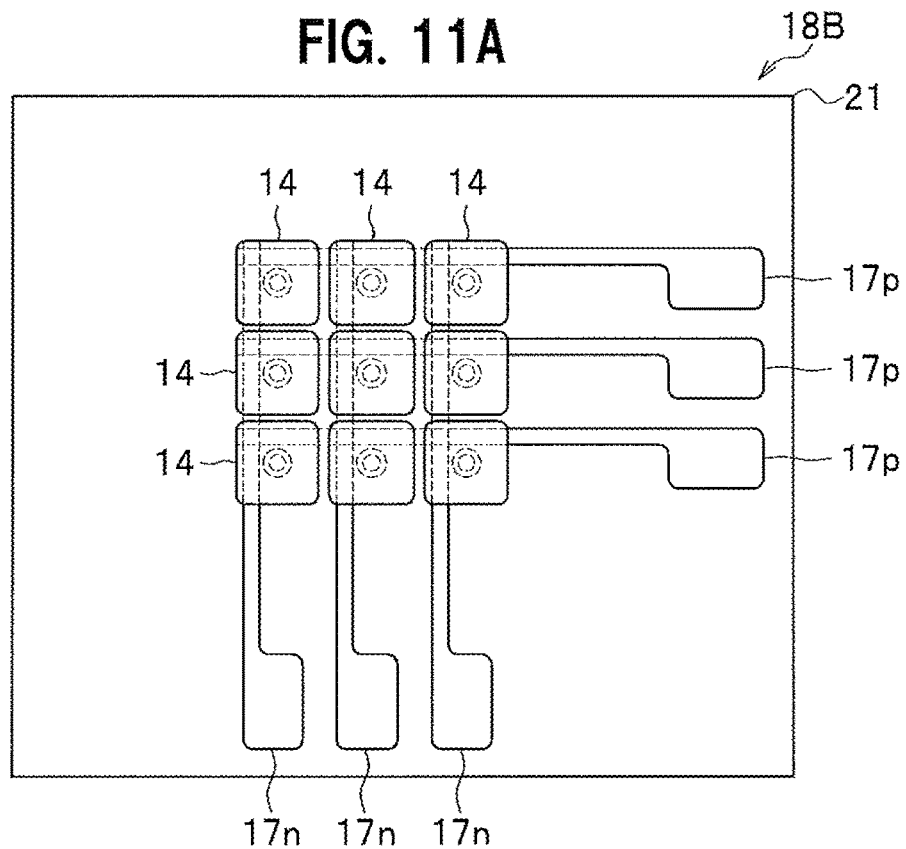
FIG. 11A is a schematic plan view of the light emitting element array chip of a light emitting device related to the second embodiment.
Figure 11B:
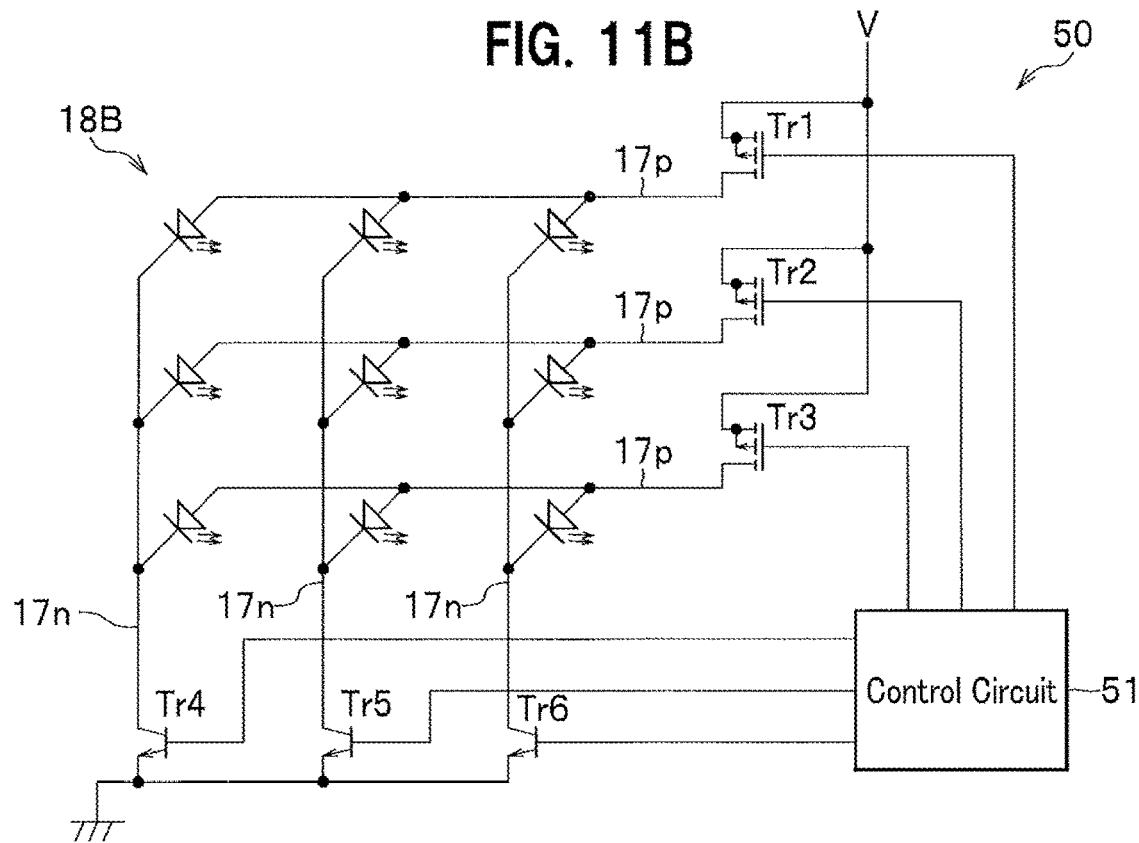
FIG. 11B is a circuit diagram showing an example of the drive circuit which drives the light emitting element array chip in FIG. 11A.

Next, the light emitting device according to the second embodiment will be explained with reference to FIG. 11A and FIG. 11B. The light emitting device in this embodiment includes, as a light emitting element array chip 18B, multiple light emitting elements 14 on the support substrate 21 as shown in FIG. 11A, and also includes a drive circuit 50 shown in FIG. 11B.

In this example, the light emitting element array chip 18B includes LEDs, which are the light emitting elements 14, arranged in a two-dimensional matrix of three rows by three columns.

The anode terminal (second electrode 16p) of each of the LEDs (light emitting elements 14) in the first row is connected to a second wire 17p, and this second wire 17p is connected to a switch Tr1.

The anode terminal (second electrode 16p) of each of the LEDs (light emitting elements 14) in the second row is connected to a second wire 17p, and this second wire 17p is connected to a switch Tr2.

The anode terminal (second electrode 16p) of each of the LEDs (light emitting elements 14) in the third row is connected to a second wire 17p, and this second wire 17p is connected to a switch Tr3.

The switches Tr1 to Tr3 are the switches for connecting the second wires 17p and a voltage source V, which are turned ON or OFF by the control circuit 51. For the switches Tr1 to Tr3, semiconductor switching elements, such as FETs (field effect transistors), can be used.

The cathode terminal (first electrode 16n) of each of the LEDs (light emitting elements 14) in the first row is connected to a first wire 17n, and this first wire 17n is connected to a switch Tr4.

The cathode terminal (first electrode 16n) of each of the LEDs (light emitting elements 14) in the second row is connected to a first wire 17n, and this first wire 17n is connected to a switch Tr5.

The cathode terminal (first electrode 16n) of each of the LEDs (light emitting elements 14) in the third row is connected to a first wire 17n, and this first wire 17n is connected to a switch Tr6.

The switches Tr4 to Tr6 are the switches for connecting the first wires 17n and GND, which are turned ON or OFF by the control circuit 51. For the switches Tr4 to Tr6, for example, bipolar transistors can be used.

The light emitting device related to this embodiment with the semiconductor layer 12 in the light emitting elements 14 being directly covered by a thin phosphor layer 40 can similarly reduce the leakage of light from an illuminating light emitting element 14 to the adjacent light emitting elements 14 that are turned off, as well as increasing the luminance. Furthermore, such a light emitting device with enhanced luminance can be manufactured in a simplified manner.

The light emitting device according to this embodiment can be suitably utilized in ADB (adaptive driving beam) headlamps and the like, as it allows the drive circuit 50 to individually drive the light emitting elements 14.

EXAMPLE

The experiment described below was conducted to confirm the performance of the light emitting device according to the present disclosure.

First, a light emitting device similar to the light emitting device 100 related to the first embodiment of the invention (the Example) was produced under the conditions described below.

Shape of and Materials for the Light Emitting Device

Size of each light emitting element 14 (one light emitting segment) of the light emitting array chip 18 per side: 150 μm Thickness of light emitting elements 14: 5 μm Number of light emitting elements 14: 200

Light emitting elements 14: blue LEDs (GaN-based semiconductor light emitting elements)

Thickness of the phosphor layer: 10 to 40 μm

Slurry Components

The slurry was prepared with phosphor particles a, resin serving as a binder b, solvent c, and AEROSIL d using the formulating weight ratio below.

a:b:c:d=15:10:25:1

Slurry Sprayed

Light transmissive resin: dimethyl silicone resin (refractive index 1.41)

Phosphor: YAG-based phosphor

Solvent: n-heptane

Experiment

For comparison with the Example, a light emitting device without a phosphor layer 40 (Comparative Example 1) was produced. Moreover, another light emitting device was prepared (Comparative Example 2) which was provided with a YAG phosphor plate of about 70 μm in thickness, in place of a phosphor layer, bonded to the upper face of the light emitting device according to Comparative Example 1.

The luminance distribution of each light emitting device was measured by illuminating one of the light emitting elements of the light emitting element array chip 18 while keeping the remaining light emitting elements turned off.

Figure 12:
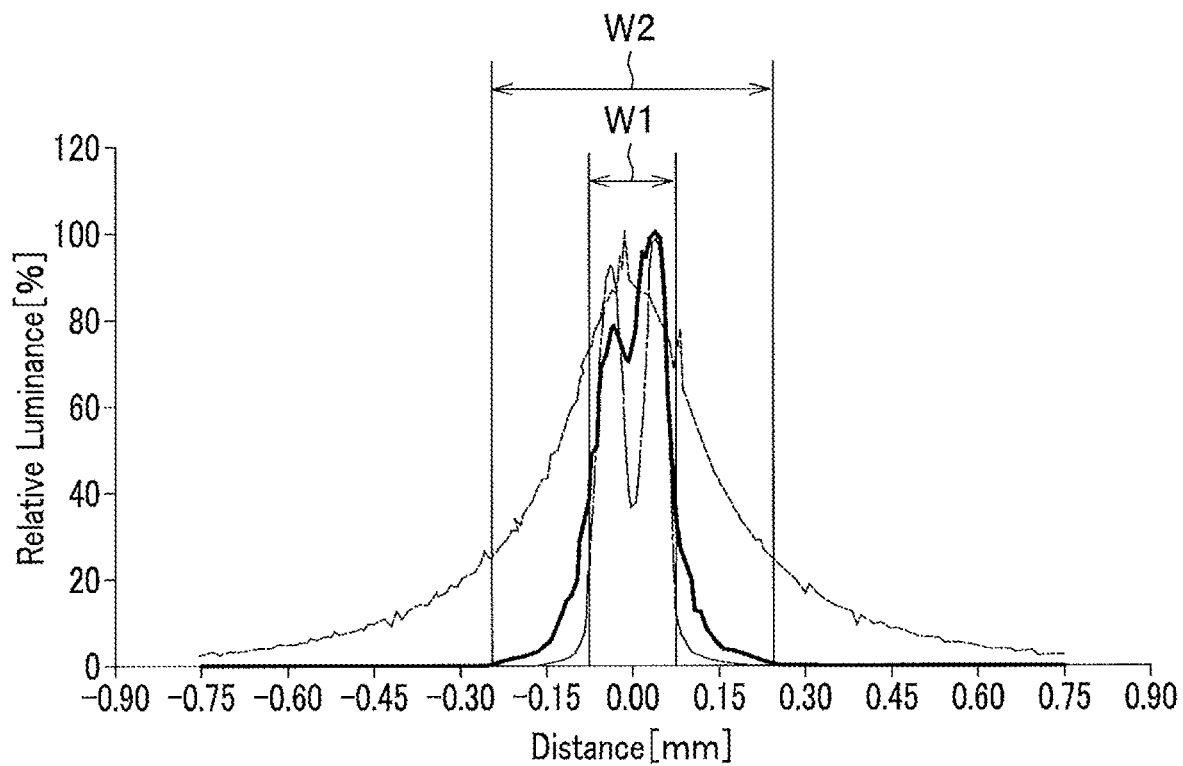
FIG. 12 is a graph showing luminance distribution of the light emitting device related to the first embodiment when one of the light emitting elements is illuminated.

FIG. 12 shows the results. The horizontal axis of the graph in FIG. 12 represents the distance [mm] from the center of the illuminating light emitting element. The vertical axis represents the relative luminance [%] when the maximum luminance of the illuminating light emitting element is 100. The range W1 indicated by an arrow represents the size of the illuminating light emitting element 14. The one-dot chain line represents Comparative Example 1, the broken line represents Comparative Example 2, and the solid line represents the Example.

It was confirmed that Comparative Example 1 had the steepest luminance distribution profile. The luminance at the center of the illuminating light emitting element in Comparative Example 1 dropped because a portion of the emission layer was removed for the purpose of disposing the first electrode.

Comparative Example 2, on the other hand, had a spread-out luminance distribution profile because the light was laterally diffused by the YAG phosphor plate.

The Example, as shown by the range W2 indicated by an arrow, achieved the luminance value that was 1/200 of the maximum luminance in the second cells from the illuminating light emitting element. In other words, in the Example, it was confirmed that the luminance of the light emitting elements located next to those that were adjacent to the illuminating light emitting element had adequately low luminance. It is believed that the light was scattered by the thinly formed phosphor layer 40 which reduced the lateral propagation in the Example. As discussed in the foregoing, the Example was confirmed to have a considerably enhanced contrast performance as compared to Comparative Example 2, and can achieve results close to those of Comparative Example 1.

What is claimed is:

1. A light emitting device comprising:
   a base;
   a first terminal and a second terminal located at an upper surface of the base;
   a light emitting element array chip mounted on the upper surface of the base such that the light emitting element array chip is located between the first terminal and the second terminal, the light emitting element array chip comprising:
   a plurality of light emitting elements,
   a support substrate having a continuous upper surface that supports the plurality of light emitting elements,
   a multilayer wiring structure disposed above the support substrate and comprising a plurality of first wirings, a plurality of second wirings, and an inter-wiring insulating film, wherein the plurality of first wirings are located above the plurality of second wirings with portions of the inter-wiring insulating film located therebetween, wherein each of the light emitting elements is arranged above and electrically connected to one of the first wirings and one of the second wirings;

a plurality of wires including a plurality of first wires connecting the plurality of first wirings to the first terminal, and a plurality of second wires connecting the plurality of second wirings to the second terminal; and a phosphor layer directly covering the light emitting element array chip so as to collectively cover surfaces of the plurality of light emitting elements, wherein an average layer thickness of the phosphor layer is 50 µm or less.

2. The light emitting device according to claim 1, wherein the phosphor layer has protrusions and recesses at a surface of the phosphor layer, and wherein a thickness of the phosphor layer at a first protrusion among the protrusions is at least twice a thickness of the phosphor layer at a first recess among the recesses.

3. The light emitting device according to claim 1, further comprising a drive circuit configured to individually drive the plurality of light emitting elements.

4. The light emitting device according to claim 1, wherein a thickness of a semiconductor layer of each of the plurality of light emitting elements is in a range of 1 to 10 µm.

5. The light emitting device according to claim 1, wherein:
the phosphor layer comprises a light transmissive resin and phosphor particles, and
a refractive index of the resin is in a range of 1.30 to 1.50.

6. The light emitting device according to claim 1, wherein an average particle diameter of phosphor particles contained in the phosphor layer is in a range of 1 to 30 µm.

7. The light emitting device according to claim 1, wherein:
the plurality of light emitting elements are arranged in a matrix of a plurality of rows and a plurality of columns; and
the phosphor layer has a surface that is flat or that has a plurality of protrusions and recesses.

8. The light emitting device according to claim 1, wherein:
ends of the plurality of first wirings are arrayed in a row at a peripheral portion of the multilayer wiring structure, outward of the plurality of light emitting elements.

9. The light emitting device according to claim 8, wherein:
ends of the plurality of second wirings are arrayed in a row at a peripheral portion of the multilayer wiring structure, outward of the plurality of light emitting elements.

10. An adaptive driving beam headlamp comprising the light emitting device according to claim 1.

* * * * *